(12) United States Patent
Lavoie

(10) Patent No.: US 6,191,725 B1
(45) Date of Patent: Feb. 20, 2001

(54) AUTOMATIC GAIN CONTROL FOR DIGITAL RADAR INTERCEPT RECEIVERS

(75) Inventor: Pierre Lavoie, Ottawa (CA)

(73) Assignee: Her Majesty the Queen in right of Canada, as represented by Minister of National Defence of Her Majesty's Canadian Government, Ottawa (CA)

(*) Notice: Under 35 U.S.C. 154(b), the term of this patent shall be extended for 0 days.

(21) Appl. No.: 09/385,441

(22) Filed: Aug. 30, 1999

(51) Int. Cl.[7] ........................................ G01S 7/34
(52) U.S. Cl. ............................. 342/92; 342/195
(58) Field of Search .................... 342/92, 159, 162, 342/174, 175, 195, 197, 203

(56) References Cited

U.S. PATENT DOCUMENTS

| | | | |
|---|---|---|---|
| 3,558,816 | * 1/1971 | Wise | 348/683 |
| 4,129,864 | 12/1978 | Carpenter et al. | 340/347 AD |
| 4,695,901 | * 9/1987 | Ryan | 380/204 |
| 4,713,689 | * 12/1987 | Veillard | 348/727 |
| 4,743,907 | * 5/1988 | Gellekink | 342/59 |
| 5,111,202 | 5/1992 | Rivera et al. | 341/139 |
| 5,161,170 | 11/1992 | Gilbert et al. | 375/98 |
| 5,410,364 | * 4/1995 | Karlock | 348/683 |
| 5,481,316 | * 1/1996 | Patel | 348/614 |

FOREIGN PATENT DOCUMENTS

06069816 * 3/1994 (JP).

* cited by examiner

Primary Examiner—John B. Sotomayor
(74) Attorney, Agent, or Firm—Larson & Taylor, PLC

(57) ABSTRACT

An automatic gain control (AGC) circuit for electromagnetic wave receiving systems, such as radar warning receivers, has a number of N parallel paths to which analog IF input signals are applied with each path being connected to one of N inputs of an output switch. Each path contains a free running sampling analog-to-digital converter (ADC) that digitizes an amplified analog IF input, the digitized signals being applied to inputs of digital delay units whose output are supplied to the output switch's inputs. The amplification in each of the N paths is fixed and staggered to provide different fixed amplifications of the IF input to the ADCs. The AGC has a leading edge trigger (LET), a trailing edge trigger (TET) and a track-and-hold circuit that samples and holds the amplitude of an input pulse starting at the leading edge as demarked by the LET. Writing of the digitized signal from the ADCs into digital delay units is started and stopped by signals from a control circuit based on a pulse's LET and TET. A pulse's TET activates the control circuit which compares the sampled and held amplitude in the track-and-hold circuit to references levels and selects a gain setting amongst the N paths that produced the largest digitized version of the analog IF pulse without ADC over-range. The control circuit then sets the output switch to the selected path and reads the data in that path out to provide a pulse-to-pulse AGC signal.

20 Claims, 4 Drawing Sheets

AUTOMATIC GAIN CONTROL FOR DIGITAL RADAR INTERCEPT RECEIVERS

FIELD OF THE INVENTION

The present invention relates generally to the field of automatic gain control circuits for electromagnetic wave reception systems and, in particular, for systems intended to provide electronic support measures, electronic intelligence and specifically for radar warning receivers that intercept and digitize pulsed radar signals.

BACKGROUND OF THE INVENTION

In general, electromagnetic wave receivers often require an automatic gain control (AGC) to process signals that exhibit large amplitude variations. Digital receiving systems, in particular, require AGC circuitry due to quantization noise and distortion in their analog-to-digital converters (ADCs). This AGC requirement is rather critical in radar intercept receivers. In these receivers, large bandwidths necessitate very high speed sampling to meet the Nyquist criterion which entails a reduced number of effective bits, signal-to-noise-and-distortion (SINAD) ratio and dynamic range. Commercial ADCs sampling at 200 million samples/s, for example, provide 7 effective bits which amounts to a SINAD of 44 dB. Assuming that 14 dB of the SINAD ratio is required for signal detection and processing, this leaves 30 dB of dynamic range. When undersampling is used, i.e. when an ADC samples a signal at an intermediate frequency higher than half its sampling rate, it is typical then for the ADCs to provide only 6 or 5 effective bits. The dynamic range obtained without an AGC, consequently, falls well short of the 60 dB or more required in radar intercept receivers.

A conventional AGC circuit for digital radar intercept receivers has an analog IF input signal applied to a video detector whose output is applied to a track-and-hold circuit that samples-and-holds the amplitude of the signal starting at the leading edge of each pulse as demarked by a leading edge trigger (LET) circuit. This sampled and held amplitude is compared to reference levels in control circuitry which provides a signal to adjust a programmable attenuator in accordance with the level of that amplitude. The analog IF input signal is applied to the programmable attenuator via an analog delay line where the signal is attenuated to a suitable level before being digitized by a sampling ADC. By delaying the pulse in an analog delay line, the fast programmable attenuator has time to settle before the arrival of the delayed pulse. This AGC circuit, as a result, operates on a pulse-by-pulse basis. The sampling ADC circuit is started and stopped by the control circuitry based on the pulse LET, a pulse trailing edge trigger (TET) circuit and the time delay of the analog delay line. The type of conventional AGC circuit is described in more detail in U.S. Pat. No. 5,161,170 by Paul H. Gilbert et al.

The available analog delay lines in the conventional AGC described above is one source of problems associated with that circuit. This results in these AGC circuits being bulky, expensive, unreliable and to require individual trimming or calibration for interoperability between radar intercept receivers. Present analog cable delay lines entail a large and heavy coil of cable for the typical time delays required. Repeaters may be inserted at regular intervals in the cable to reduce signal attenuation but this is at the expense of bulk and reliability.

Available surface acoustic wave (SAW) delay lines have a limited bandwidth, an insertion loss of the order of 30 dB and produce significant signal distortions. These distortions will reduce interoperability between receivers, at least unless the SAW devices are individually trimmed to distort the signal alike which incurs additional costs. The optical delay lines presently available reduce the dynamic range due to limitations of available photo-detectors.

Another drawback of this conventional AGC circuit is that the time delay of the analog delay lines is fixed. If the rise time of a radar pulse exceeds that time delay, for instance, the control circuitry will not detect the true peak of the pulse and may select insufficient attenuation and the pulse upon reaching the ADC may cause an over-range. The same may also happen if the pulse exhibits amplitude variation, whether intentional or unintentional.

SUMMARY OF THE INVENTION

It is an object of the present invention to provide a pulse-to-pulse automatic gain control (AGC) circuit for an electromagnetic wave receiver having an adaptive time delay circuit for a received signal pulse.

An automatic gain control (AGC) circuit for an electromagnetic wave receiving system, according to one embodiment of the present invention, comprises an analog IF input connected to inputs of N parallel paths wherein an output of each path is connected to one of N inputs of an output switch; each of the N parallel paths containing a free-running sampling analog-to-digital converter (ADC), an output of each ADC being applied to a digital delay unit having an output forming the output for that path which is connected to one of the N inputs of said output switch, a number of the paths containing a signal amplitude modifier connected to an input of an associated ADC, the signal amplitude modifiers having fixed modification values that are staggered to provide an analog IF input signal to the sampling ADCs where the input to each sampling ADC has a different signal amplitude value; the AGC circuit having a video detector connected to receive the IF input and to provide a video input signal to a track-and-hold circuit, a means to determine the leading edge of each input signal pulse with a leading edge trigger (LET), a means to determine the trailing edge of each input signal pulse by a trailing edge trigger (TET), wherein the LET is connected to the track-and-hold circuit and to control circuitry with the TET being connected to the control circuitry which has a read/write control line connected to each digital delay unit and a gain control line connected to the output switch, the track-and-hold circuit being connected to the control circuitry and samples and holds the amplitude of an input pulse starting at the leading edge as demarked by the LET while IF signals in each input path with staggered amplitude values are digitized by the free-running ADCs and written into an associated digital delay unit, the writing into the delay units being started and stopped by signals from the control circuitry based on a pulse's LET and TET, the control circuitry comparing the sampled-and-held amplitude from the track-and-hold circuit to reference levels once the TET is activated and then selects a path amongst the N paths that produced the largest digitized version of the analog IF pulse without ADC over-range, the control circuitry then setting the switch to a setting that allows the data from the selected path to be read out to provide a leveled digital IF output at an output of the AGC circuit.

BRIEF DESCRIPTION OF THE DRAWINGS

The following detailed description of the invention will be more readily understood when considered in conjunction with the accompanying drawings, in which.

DESCRIPTION OF THE PREFERRED EMBODIMENTS

Figure 1:
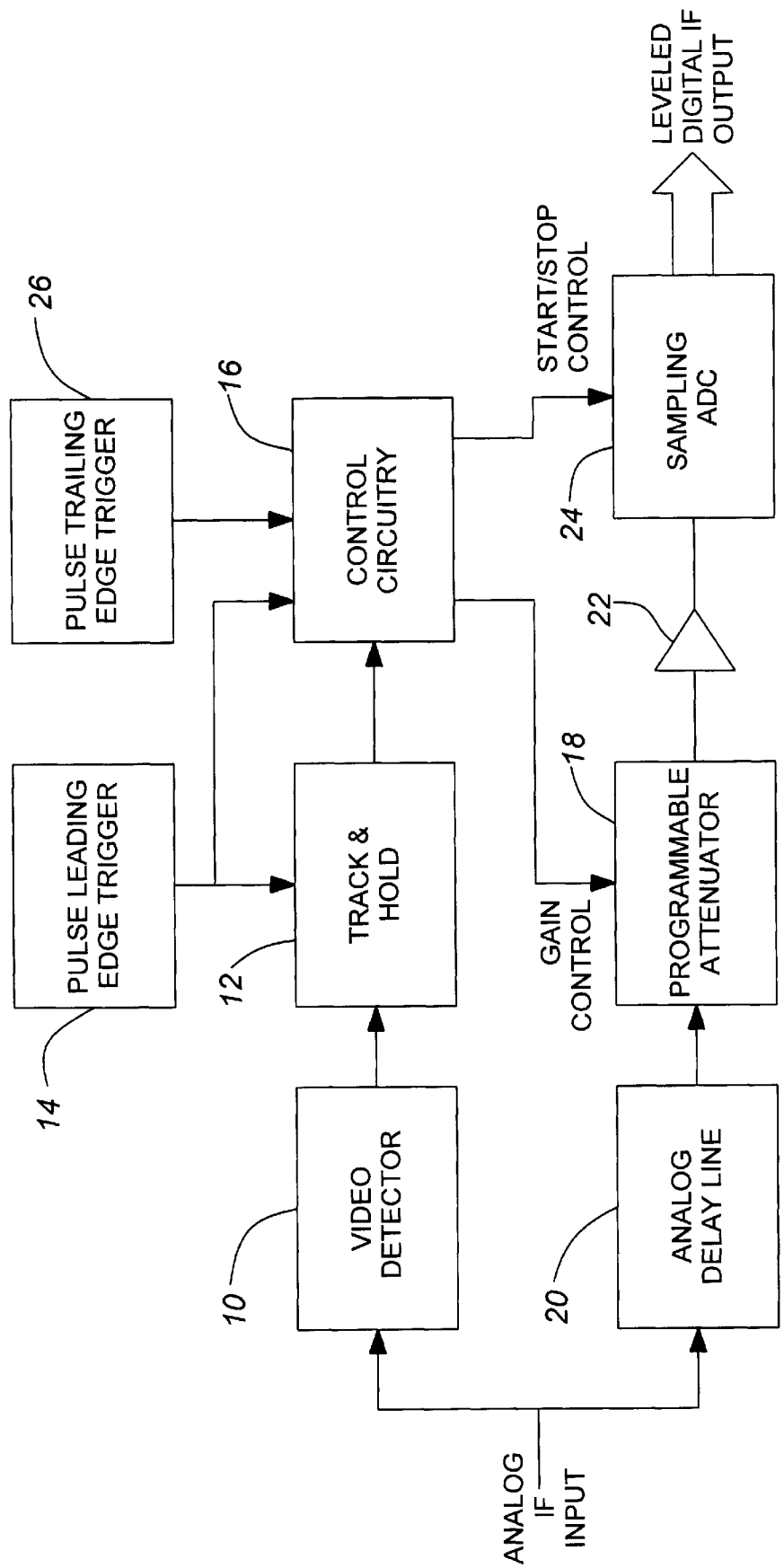
FIG. 1 is a block diagram of a conventional pulse-to-pulse automatic gain control circuit for a digital radar intercept receiver.

A conventional automatic gain control (AGC) circuit for digital radar intercept receivers is illustrated in FIG. 1. This type of pulse-to-pulse AGC circuit is described in U.S. Pat. No. 5,161,170 by Paul H. Gilbert et al. An analog IF input signal of a received radar pulse is applied to a video detector circuit 10 which outputs the amplitude of the analog IF signal to the input of a track-and-hold circuit 12. The track-and-hold circuit 12 samples and holds the amplitude of that signal starting at the leading edge of each pulse as demarked by a signal from a pulse leading edge trigger (LET) circuit 14 which is applied to track-and-hold circuit 12. The sampled and held amplitude is compared to reference levels in control circuitry 16 to provide a signal to adjust programmable attenuator 18 in accordance with the level of that amplitude. The analog IF input signal is applied to the programmable attenuator 18 via an analog delay line 20. By delaying the analog IF input current pulse in the analog delay line 20, the fast programmable attenuator 18 has time to settle before the arrival of this delayed pulse. This arrangement provides an AGC circuit which operates on a pulse-by-pulse basis. The leveled IF signal output pulse produced by the programmable attenuator is applied to an amplifier 22 that amplifies that pulse and applies it to a sampling analog-to-digital converter (ADC) 24 which digitizes the signal. The sampling ADC 24 is started and stopped by the control circuitry 16 based on the pulse LET, a pulse trailing edge trigger (TET) detected by circuit 26 whose output is applied to control circuitry 16 and the time delay of the analog delay line 20.

One of the problems associated with the AGC circuit shown in FIG. 1 is that available delay lines for analog signals require a compromise between size, distortion, dynamic range, bandwidth and time delay. This results in AGC circuits that are bulky, expensive, unreliable and which require individual trimming or calibration for interoperability between radar intercept receivers. Cable delay lines for analog signals require a large and heavy coil of cable for the typical time delays required. Repeaters may be inserted at regular intervals in the cable to reduce signal attenuation but this is at the expense of both bulk and reliability. Surface acoustic wave (SAW) delay lines for analog signals presently available have a limited bandwidth, an insertion loss of the order of 30 dB and produce significant signal distortions. Optical fiber delay lines reduce dynamic range due to limitations of available photo-detectors. The time delay of these type of delays lines is fixed and can not be altered. If the rise time of a radar pulse exceeds that time delay, then the control unit does not detect the time peak of the pulse and may select insufficient attenuation. The true peak of that pulse upon reaching the ADC 24 may cause an over-range. The same can happen if the pulse exhibits amplitude variation, whether they are intentional or unintentional.

Figure 2:
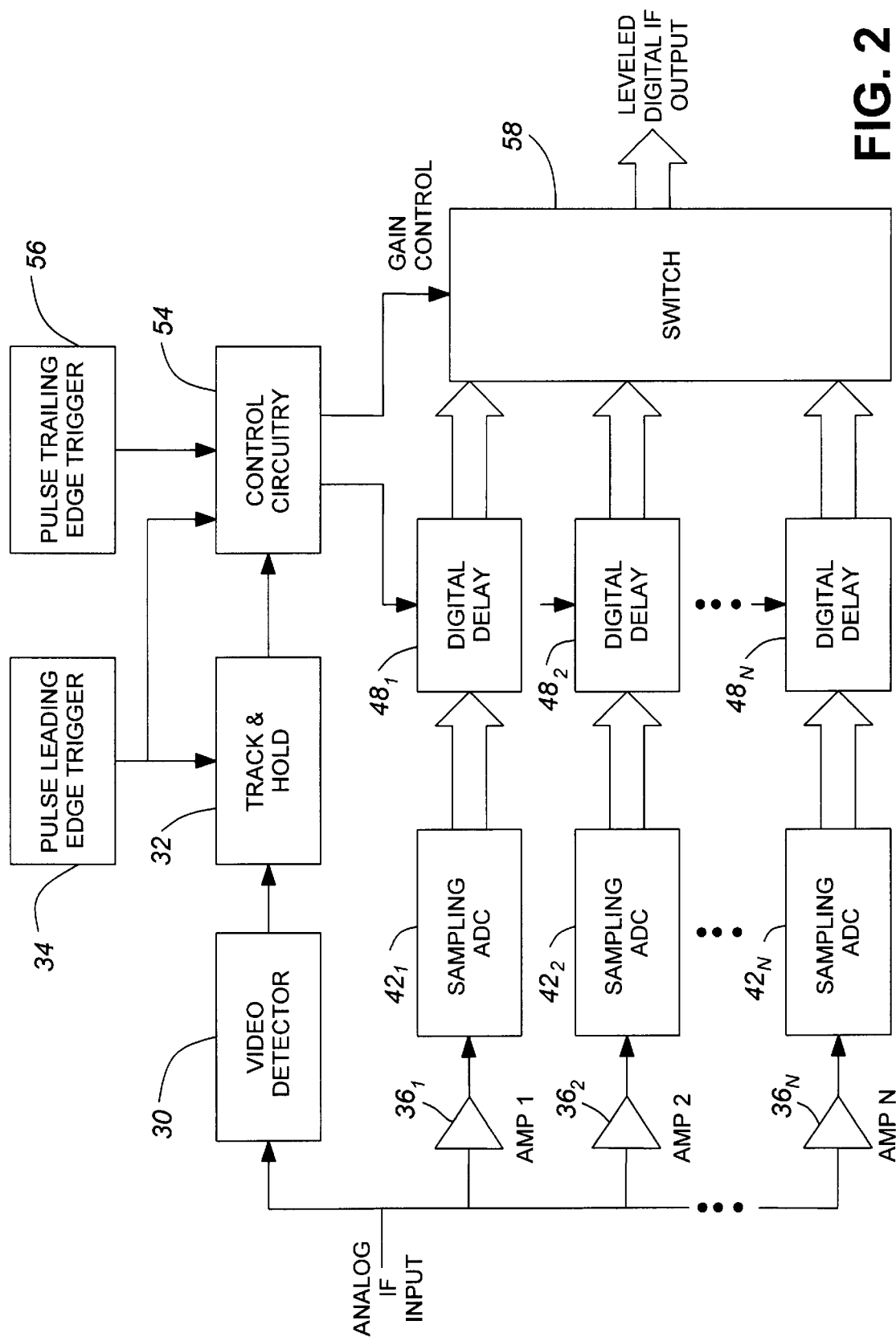
FIG. 2 is a block diagram of a pulse-to-pulse automatic gain control circuit for a digital radar intercept receiver accordingly to one embodiment of the present invention.

A pulse-to-pulse AGC circuit according to one embodiment of the present invention, one which avoids problems associated with the use of an analog delay line, is illustrated in FIG. 2. In this AGC circuit, the analog IF input signal is applied to a video detector 30 whose output is applied to a track-and-hold circuit 32 where the amplitude of the input pulse is sampled-and-held starting at the leading edge of each pulse as demarked by a pulse leader edge trigger (LET) detector 34 whose output is applied to the track-and-hold circuit 32. The amplitude from the track-and-hold circuit 32 is applied to the control circuitry 54 where it is compared to reference levels. The output from the pulse leading edge trigger detector 34 is also applied to the input of control circuitry along with the output from a pulse trailing edge trigger (TET) detector 56 which controls the timing of output signals from the control circuitry 54. The circuitry up to this stage is similar to that shown in FIG. 1. However, in FIG. 2, one control signal from the control circuitry is applied to a switch 58 having inputs from N parallel paths, each of which contains one of N digital delay units $48_1$, $48_2$ - - - $48_n$. Writing into the digital delay units $48_1$ to $48_n$ is started and stopped by a control signal applied to each delay unit from an output of control circuitry 54 based on signals to that control circuitry from the pulse LET 34 and pulse TET 56 detectors as well as the memory size of the digital delay units. Each of the N parallel paths to switch 58 contains one of N signal amplitude modifiers, i.e. amplifiers $36_1$, $36_2$ - - - $36_n$ whose output is connected to an associated one of N sampling free-running ADCs $42_1$, $42_2$ - - - $42_n$. The output of each of the sampling ADCs $42_1$ to $42_n$ is connected to an associated digital delay unit in that particular parallel path and the outputs from the digital units provide the N input signals to switch 58. The N signal amplitude modifiers could be attenuators depending on the input signal amplitude rather than amplifiers $36_1$ to $36_n$.

In this AGC circuit, the analog IF input signal is applied to the inputs of each of the N amplifiers $36_1$, $36_2$ - - - $36_n$ and the outputs of each of those amplifiers is applied to the input of an associated sampling ADC (one of ADCs $42_1$, $42_2$ - - - $42_n$) in one of the N paths, the ADCs digitizing the amplified signal. The analog IF input signal is simultaneously amplified by the N amplifiers $36_1$, $36_2$ - - - $36_n$ which have fixed gains, the fixed gains being staggered and this constitutes the possible gain settings for this AGC circuit. The N amplified IF signals are digitized by the N free-running ADCs $42_1$, $42_2$ - - - $42_n$ and each digitized signal is written into an associated digital delay unit (one of delay units $48_1$, $48_2$ - - - $48_n$). Writing into the digital delay units is simultaneously started and stopped by the control circuitry 54 based on the LET and TET for the pulse and on the memory size of the digital delay units. After the trailing edge of a pulse is detected by TET 56 and applied as a trigger signal to control circuitry 54, the control circuitry 54 compares the sampled and held amplitude of the pulse it obtains from the track-and-hold circuit 32 to reference levels and the selects one of the N possible gain settings. The chosen gain setting is one that corresponds to an amplifier in one of the paths which produces the largest digitized version of the analog IF pulse without ADC over-range. The control circuitry then connects the digital delay unit in that chosen path, i.e. the one containing the amplifier having the chosen gain, to the output of the AGC circuit by means of switch 58 and allows the data in that delay unit to be read out as the leveled digital IF output. The data in the other digital delay units is discarded. By choosing the gain selected by the control circuitry to be inversely proportional to the amplitude of the pulse, strong and weak pulses can have similar amplitude at the digital IF output.

One advantage of the AGC circuit illustrated in FIG. 2 is that the delay lines resides in the digital domain and can be implemented using first-in-first-out circuits, random-access memories (RAM) or dual-ported RAMs. Therefore, these delay lines can be small, economical, reliable and very long delays are practical. Another advantage is that individual trimming or calibration is unnecessary for interoperability between radar intercept receivers and the AGC performance is stable over time, temperature changes and other variable environmental conditions.

Another advantage of the AGC in the embodiment illustrated in FIG. 2 is that all the components in this AGC can be implemented using microelectronics and, as a result, the whole AGC can be miniaturized and integrated into a multi-chip module. A further advantage of the circuit in FIG. 2 is that the time delay need not be fixed as in FIG. 1 but can be adaptive. Unlike the AGC of FIG. 1, the AGC of FIG. 2 can immediately select a path and make the AGC output available upon reaching the end of a short input pulse. For pulses with slow rise times or varying amplitude, the control circuitry in FIG. 2 can wait until the end of the pulse to select a path which avoids the over-range problem of the prior art for these type of pulses. This AGC circuit, as a result, can provide a pulse-to-pulse AGC signal for pulses having varying widths and/or amplitudes.

The track-and-hold circuit 32 in FIG. 2 may consist of a free-running ADC followed by digital logic. The digital logic, in this case, receives digital words produced by and received from the free-running ADC in 32 to measure the peak amplitude (MAX) following the leading edge trigger (LET). The free-running ADC in 32 is in addition to the N sampling ADCs $42_1$ to $42_n$ in the N parallel paths and can run at a different sampling rate.

Figure 3:
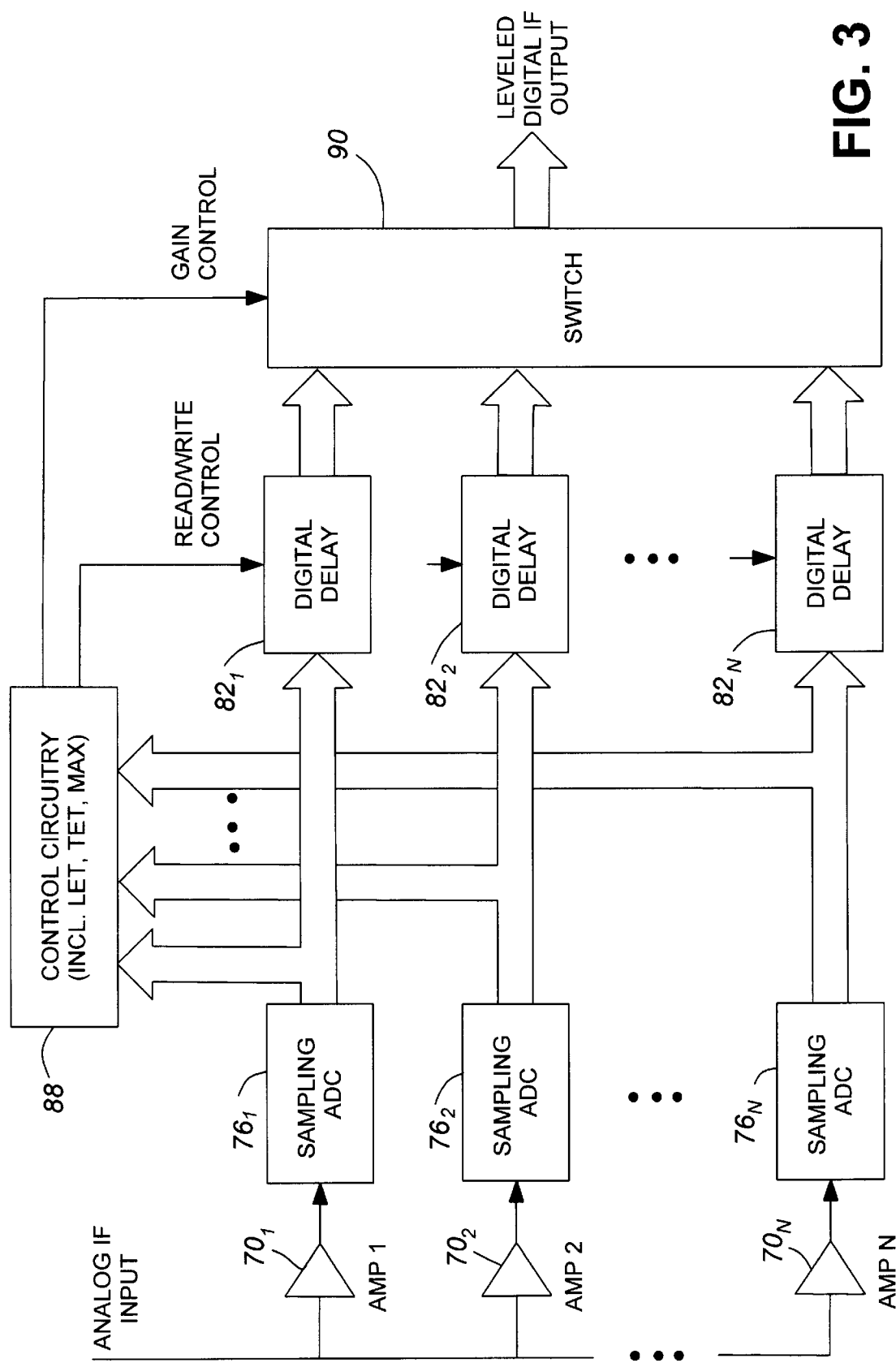
FIG. 3 is a block diagram of a pulse-to-pulse automatic gain control circuit for a receiver according to another embodiment of the invention.

Another embodiment of the present invention is illustrated in the AGC circuit of FIG. 3. This AGC circuit is similar to the one in FIG. 2 in that N paths are supplied to N inputs of a switch with each path having an analog IF input to an amplifier whose output is applied to a free-running sampling ADC, the digitized output of the ADC being applied to a digital delay unit which delay units provide the N inputs to the switch. The analog IF input is, as in FIG. 2, simultaneously amplified by the N amplifiers $70_1, 70_2$ - - - $70_n$ in each of the N paths, the amplifiers $70_1, 70_2$ - - - $70_n$ having fixed gains which are staggered with those staggered gains constituting the possible gain settings for this AGC circuit. The N amplified IF signals, as in the previous AGC circuit of FIG. 2, are digitized by the N free-running ADCs ($76_1, 76_2$ - - - $76_n$) and then wrote into associated N digital delay units ($82_1, 82_2$ - - - $82_n$). Writing into the digital delay units $82_1, 82_2$ - - - $82_n$ is simultaneously started and stopped by signals on control lines from the control circuitry 88.

In the control circuitry 88, the video detector 30 and track-and-hold circuit 32 inclusive (incl.) of FIG. 2 have been replaced by digital logic which receives digital data words produced by and received from the sampling ADCs in the N paths. The control circuitry 88 also contains digital logic for a leading edge trigger (LET), a trailing edge trigger (TET) and for maximum magnitude (MAX) detection. The digital logic uses the data words produced by the ADCs to trigger on the leading edge of each radar pulse and measure the peak amplitude following that trigger. After the pulse's TET is detected by the digital logic in circuitry 88, that control circuitry 88 selects the gain setting that corresponds to the gain setting of the amplifier amongst $70_1, 70_2$ - - - $70_n$ which produces the largest digitized version of the analog IF pulse without an ADC over-range. The control circuitry 88 then connects the digital delay unit ($82_1, 82_2$ - - - or $82_n$) in the $N^{th}$ path which corresponds to the chosen gain to the output of the AGC circuit by a control signal applied to switch 90 and allows the data from that delay unit to be read out. The data in all the other N digital delay units may then be discarded.

An advantage of the embodiment illustrated in FIG. 3 over that of FIG. 2 is that the video detector and track-and-hold circuits of FIG. 2 have been replaced by digital logic in control circuitry 88. The control circuitry 88 also contains digital logic for a leading edge trigger (LET), a trailing edge trigger (TET) and MAX detection circuit. The digital logic in control circuitry 88 uses data words produced by and received from the ADCs to trigger on the leading edge of each radar pulse and to measure the peak amplitude (MAX) following that trigger. The inclusion of video detection, track-and-hold, LET, TET and MAX in digital logic in control circuitry 88 eliminates analog components which eases the implementation of the AGC into a multi-chip module and possibly into integration on a single chip.

Figure 4:
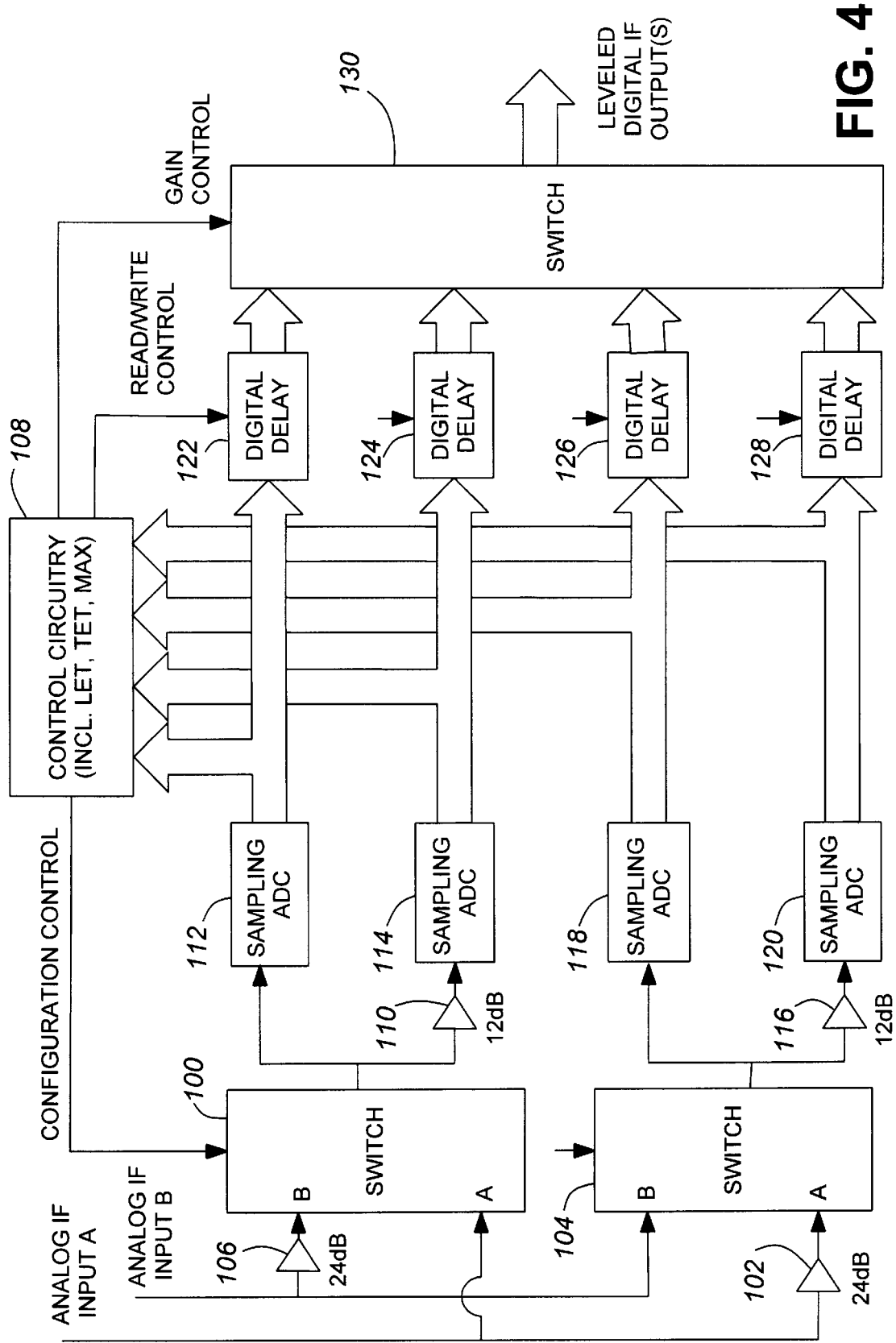
FIG. 4 is a block diagram of a multi-channel reconfigurable pulse-to-pulse automatic gain control circuit for a receiver according to a further embodiment of the invention.

Another embodiment of the present invention for multi-channel digital receivers is illustrated in the block diagram of FIG. 4. This multi-channel receiver has two analog IF inputs (input A and input B) with input A being applied directly to an input of a first switch 100 and to an amplifier 102 where it is amplified before being applied to an input of a second switch 104. The second input B is applied directly to another input of second switch 104 and it is amplified by an amplifier 106 before being applied to another input of the first switch 100. The first and second switches 100 and 104 are controlled by inputs from a configuration control line that is connected to an output of control circuitry 108. The control circuitry 108 is similar to the one in FIG. 3 in that the video detector and track-and-hold circuit of FIG. 2 are included in control circuitry 108 by digital logic along with the LET, TET and MAX detectors. The digital logic in 108 receives digital data words from sampling ADCs in N parallel paths leading via digital delay units to inputs of a switch 130 which is similar to the circuitry shown in FIG. 3. Both switches 100 and 104 are individually toggled by the control circuitry 108 which also applies control signals to switch 130 to select the appropriate gain settings for the AGC circuit via those switches.

One output of the first switch 100 is applied directly to the input of a first sampling ADC 112 in a first path of the N paths and the output of 112 is applied to the input of a first digital delay unit 122 whose output is applied to a first input of the switch 130. The output from the first switch 100 is amplified by amplifier 110 and applied to a second sample ADC 114 in a second path of the N paths. The output from the second sampling ADC 114 is then applied to a second input of switch 130 after being delayed by a digital delay unit 124 in this second path. One output from the second switch 104 is directly applied to the input of a third sampling ADC 118 in a third path of the N paths and the output of sampling ADC 118 is applied to a third input of switch 130 after being delayed by a digital delay unit 126 in that third path. Another output of second switch 104 is amplified by amplifier 116 and then applied to an input of a fourth sampling ADC 120 in a fourth path of the N paths. The output from sampling ADC 120 is then applied to a fourth input of switch 130 after being delayed by a digital delay unit 128 in the fourth path. Writing the digitized data from the ADCs into the digital delays units is started and stopped by signals from the control circuitry based on a pulse LET, TET and the memory size of the digital delay units.

Each of the switches 100, 104 can accept analog IF input data from either input A or B, switch 100 accepting input A directly or input B from amplification by 106 while switch 104 can accept data from input B directly or from input A after amplification by amplifier 102. The switches can apply their outputs to one of the sampling ADC directly or after amplification by amplifiers. This allows for four configurations to be selected by the control circuitry 108. Assuming, with no loss in generality, that the gain of amplifiers 102 and 106 are 24 dB each and the gain of amplifiers 110 and 116 are each 12 dB, then the signals that reach the four ADCs for each possible AGC configuration with switches 100 and 104 are listed below in Table 1.

TABLE 1

| Switch 100 Input | Switch 104 Input | ADC 112 Gain | ADC 114 Gain | ADC 118 Gain | ADC 120 Gain |
|---|---|---|---|---|---|
| A | A | A(0 + 0dB) = A(+0dB) | A(0 + 12dB) = A (+12dB) | A(24 + 0dB) = A(+24 dB) | A(24 + 12dB) = A(+36 dB) |
| B | B | B(24 + 0dB) = B(+24dB) | B(24 + 12dB) = B(+36dB) | B(0 + 0dB) = B(+0 dB) | B(0 + 12dB) = B(+12 dB) |
| A | B | A(0 + 0dB) = A(+0db) | A(0 + 12dB) = A (+12dB) | B(0 + 0dB) = B(+0 dB) | B(0 + 12dB) = B(+12 dB) |
| B | A | B(24 + 0dB) = B(+24dB) | B(24 + 12dB) = B (+36dB) | A(24 + 0dB) = A(+24 dB) | A(24 + 12dB) = A(+36 dB) |

The first and second configurations of Table 1 provide full range AGC of inputs A and B, respectively, and are functionally equivalent to the embodiment in FIG. 3 with 4 paths, i.e. when N=4 in FIG. 3. In the first configuration of Table 1, the signals appearing at the inputs of ADCs 112, 114, 118 and 120 correspond to input A when amplified by 0, 12, 24 and 36 dB, respectively, and this constitutes all possible gain settings. The four signals, once digitized by the ADCs, are written into the digital delay units 122, 124, 126 and 128. Writing into the digital delay units is started and stopped by the control circuitry 108 which contains digital logic for a leading edge trigger (LET), a trailing edge trigger (TET) and maximum magnitude MAX detection. The control circuitry 108, after the pulse TET signal, selects the gain setting that corresponds to the ADC, amongst the four ADCs, that produced the largest digitized version of the analog IF input A without ADC over-range. The control circuitry 108 then connects the digital delay unit in the path corresponding to the one with the selected gain to the output of the AGC by means of switch 130 to allow the data from that path to be readout. In the second configuration of Table 1, the signals appearing at the inputs of ADCs 112, 114, 118 and 120 correspond to input B when amplified by 24, 36, 0 and 12 dB, respectively. Except for a different ordering of gain settings, the functionality is similar to that of the first configuration.

The third and fourth configurations in Table 1 provide multi-channel pulse-by-pulse AGC by sharing the apparatus between two inputs A and B. In the third configuration, the ADCs 112 and 114 receive the signal A amplified by 0 and 12 dB, respectively, while the ADCs 118 and 120 received the signal B similarly amplified. The four signals are digitized by the ADCs and written into their associated digital delay units 122, 124, 126 and 128 under control of the control circuitry 108 via a control line connected to the delay units. Writing into the digital delay units is started and stopped by the control circuitry which contains digital logic for LETs, TETs and MAXs detection.

Control circuitry 108 can have two different modes of operation, a "master-slave" or a "first-come-first-served" mode. In the "master-slave" mode, one of the channels is externally chosen to be a master whilst the others are slaves. The LET and TET signals from the master channel are used to start and stop writing into all the digital delay units. In the "first-come-first-served" mode, the first channel to receive a pulse LET becomes a master. In case of contention, i.e. simultaneous LETs in two or more channels, any rule may be used to choose which one of the contending channels will be the master. This rule can be implemented in a look-up table. The LET and TET signals from the master channel are used to start and stop writing into all the digital delay units. Each channel will have its own MAX detector and hence an independently chosen gain no matter which mode is implemented in control circuitry 108.

The control circuitry 108 selects two gain settings after a TET signal. The first gain setting corresponds to the ADC 112 or 114 that produced the largest digitized version of input A without ADC over-range whereas the second gain setting corresponds to the ADC 118 or 112 that produced the largest digitized version of input B without ADC over-range. The control circuitry 108 then connects the digital delay unit 122 or 124 which corresponds to the first chosen gain, i.e. the one associated with the ADC 112 or 114 having the selected gain, to the output of the AGC by means of a control signal to switch 130 and allows the digitized data from the selected path to be read out. In a similar manner, the control circuitry 108 connects the digital delay unit 126 or 128 corresponding to the second chosen gain to the output of the AGC by switch 130 and allows the digitized data from the selected path to be read out. The AGC occurs in parallel in the two channels A and B.

In the fourth configuration of Table 1, the ADCs receive IF input B (from switch 100) and IF input A (from switch 104) with input B being amplified by 24 dB at the input of ADC 112 and 36 dB at the input of ADC 114 while input A is amplified by 24 dB at the input of ADC 118 and 36 dB at the input of ADC 120. Except for a 24 dB offset in gain settings, the functionality is similar to that of the third configuration.

One advantage of the embodiment described with respect to FIG. 4 is the flexibility to trade instantaneous dynamic range for simultaneous digitization of multiple channels on a pulse-by-pulse basis. This flexibility is attractive for digital receivers that have multiple apertures, e.g. interferometers. The prior art AGCs, such as that illustrated in FIG. 1, must be duplicated for every channel of a receiver but an AGC according to the type in FIG. 4 can be shared between channels. The receiver with an AGC according to FIG. 4 can, on a pulse-to-pulse basis, choose between digitizing a single antenna with a full instantaneous dynamic range, e.g. to detect new signals, or digitizing multiple antennas with a subset of the full dynamic range, e.g. to measure the incident angle of a known signal.

Various modification may be made to the preferred embodiments without departing from the spirit and scope of the invention as defined in the appended claims. In any of the described embodiments, for instance, each one of the ADCs may be preceded by a "limiter circuit" to prevent temporary or permanent malfunction of an ADC device due to excessive input voltage. These limiter circuits would leave an input signal intact if its magnitude is less than or equal to the full input range of an associated ADC and limit (or compress) an input signal when its magnitude becomes greater than the full range of the ADC. Furthermore, the amplifiers connected to inputs of the ADCs in the N parallel paths may be replaced by attenuators depending on the amplitude of the input signal to those N parallel paths.

The embodiments of the invention in which an exclusive property or privilege is claimed are defined as follows:

1. An automatic gain control (AGC) circuit for an electromagnetic wave receiving system, the AGC circuit comprising an analog IF input connected to inputs of N parallel paths wherein an output of each path is connected to one of N inputs of an output switch; each of the N parallel paths containing a free-running sampling analog-to-digital converter (ADC), an output of each ADC being applied to a digital delay unit having an output forming the output for that path which is connected to one of the N inputs of said output switch, a number of the paths containing a signal amplitude modifier connected to an input of an associated ADC, the signal amplitude modifiers having fixed modification values that are staggered to provide an analog IF input signal to the sampling ADCs where the input to each sampling ADC has a different signal amplitude value; the AGC circuit having a video detector connected to receive the IF input and to provide a video input signal to a track-and-hold circuit, a means to determine the leading edge of each input signal pulse with a leading edge trigger (LET), a means to determine the trailing edge of each input signal pulse by a trailing edge trigger (TET), wherein the LET is connected to the track-and-hold circuit and to control circuitry with the TET being connected to the control circuitry which has a read/write control line connected to each digital delay unit and a gain control line connected to the output switch, the track-and-hold circuit being connected to the control circuitry and samples and holds the amplitude of an input pulse starting at the leading edge as demarked by the LET while IF signals in each input path with staggered amplitude values are digitized by the free-running ADCs and written into an associated digital delay unit, the writing into the delay units being started and stopped by signals from the control circuitry based on a pulse's LET and TET, the control circuitry comparing the sampled-and-held amplitude from the track-and-hold circuit to reference levels once the TET is activated and then selects a path amongst the N paths that produced the largest digitized version of the analog IF pulse without ADC over-range, the control circuitry then setting the switch to a setting that allows the data from the selected path to be read out to provide a leveled digital IF output at an output of the AGC circuit.

2. An automatic gain control (AGC) circuit as defined in claim 1, wherein said signal amplitude modifier is an amplifier.

3. An automatic gain control (AGC) circuit as defined in claim 2, wherein there are 4 of said parallel paths.

4. An automatic gain control (AGC) circuit as defined in claim 3, wherein the receiving system is a multi-channel receiving system with a first channel having a first analog IF input connected by a first amplifier to one input of a first switch and connected directly to one input of a second switch and with a second channel having a second analog IF input connected directly to a second input of said first switch and via a second amplifier to a second input of the second switch, an output of the first switch being connected directly to the ADC in a first of the N parallel paths and via a third amplifier to the ADC in a second of the N parallel paths and an output of the second switch being connected directly to the ADC in a third of the N parallel paths and via a fourth amplifier to the ADC in a fourth of the N parallel paths, the first and second amplifiers having different fixed amplifications from that of the third and fourth amplifiers and function as said signal amplitude modifiers, the first and second switches having their contact positions from input to output controlled by a signal on a configuration control line from an output of said control circuit to control the first and second switches to determine which analog IF input signal is applied to the ADCs and the amplification of those signals at the ADCs input.

5. An automatic gain control (AGC) circuit as defined in claim 2, wherein the analog IF input is applied directly to the video detector whose output is connected to the track-and-hold circuit.

6. An automatic gain control (AGC) circuit as defined in claim 5, wherein there are 4 of said parallel paths.

7. An automatic gain control (AGC) circuit as defined in claim 2, wherein digitized analog IF input signals from outputs of the sampling ADCs are applied to the control circuitry with the video detector and track-and-hold circuit being included in this control circuit by digital logic performing those functions using digital data words from said sampling ADCs, the control circuit further including digital logic for performing the functions of the LET, the TET and for a maximum magnitude (MAX) detector.

8. An automatic gain control (AGC) circuit as defined in claim 7, wherein there are 4 of said parallel paths.

9. An automatic gain control (AGC) circuit as defined in claim 8, wherein the receiving system is a multi-channel receiving system with a first channel having a first analog IF input connected by a first amplifier to one input of a first switch and connected directly to one input of a second switch and with a second channel having a second analog IF input connected directly to a second input of said first switch and via a second amplifier to a second input of the second switch, an output of the first switch being connected directly to the ADC in a first of the N parallel paths and via a third amplifier to the ADC in a second of the N parallel paths and an output of the second switch being connected directly to the ADC in a third of the N parallel paths and via a fourth amplifier to the ADC in a fourth of the N parallel paths, the first and second amplifiers having different fixed amplifications from that of the third and fourth amplifiers and function as said signal amplitude modifiers, the first and second switches having their contact positions from input to output controlled by a signal on a configuration control line from an output of said control circuit to control the first and second switches and determine which analog IF input signal is applied to the ADCs and the amplification of those signals at the ADCs input.

10. An automatic gain control (AGC) circuit as defined in claim 5, wherein the receiving system is a multi-channel receiving system with a first channel having a first analog IF input connected by a first amplifier to one input of a first switch and connected directly to one input of a second switch and with a second channel having a second analog IF input connected directly to a second input of said first switch and via a second amplifier to a second input of the second switch, an output of the first switch being connected directly to the ADC in a first of the N parallel paths and via a third amplifier to the ADC in a second of the N parallel paths and an output of the second switch being connected directly to the ADC in a third of the N parallel paths and via a fourth amplifier to the ADC in a fourth of the N parallel paths, the first and second amplifiers having different fixed amplifications from that of the third and fourth amplifiers and function as said signal amplitude modifiers, the first and second switches having their contact positions from input to output controlled by a signal on a configuration control line from an output of said control circuit to control the first and second switches and determine which analog IF input signal is applied to the ADCs and the amplification of those signals at the ADCs input.

11. An automatic gain control (AGC) circuit for an electromagnetic wave receiving system, the AGC circuit comprising a video detector connected to receive an IF input signal from the receiving system, a first circuit means connected to an output of the video detector to sample-and-hold the amplitude of an IF input signal pulse, a second circuit means for detecting the leading edge of an input signal pulse to provide a leading edge trigger (LET) signal and a third circuit means for detecting the trailing edge of an input signal pulse to provide a trailing edge trigger (TET) signal which are connected to receive an IF input pulse, an output from the second circuit means (LET) being connected to an input of the first circuit means and to an input of control circuitry, the first circuit means output being connected to the control circuitry, an output from the third circuit mean (TET) being connected to another input of the control circuitry which has a gain control signal line connected to a control input of a switch having N inputs, each of which are connected to outputs of N parallel paths whose inputs are connected to receive an analog IF input signal from the receiving system, each of the N parallel paths having an amplifier connected to receive the analog IF input signal with an output being connected to a free-running sampling analog-to-digital (ADC) converter that provides a digitized IF signal to a digital delay unit having a read/write control line connected to an output from the control circuitry, an output of each digital delay unit being connected to one of N inputs of said switch which has one single output, each of the amplifiers having a different fixed amplification value to provide an IF signal in the paths with staggered amplifications, wherein the writing into the delay units is started and stopped by signals from the control circuitry based on a pulse's LET and TET, the control circuitry comparing the sampled-and-held amplitude from the first circuit means to reference levels once the TET is activated and then selects an amplification gain setting amongst the N paths that produced the largest digitized version of the analog signal IF pulse without ADC over-range, the control circuitry setting the switch to a position that allows the data from the selected path to be read out to provide a leveled digital IF output at the switch's output.

12. An automatic gain control (AGC) circuit as defined in claim 1, wherein said signal amplitude modifier is an attenuator.

13. An automatic gain control (AGC) circuit as defined in claim 12, wherein there are 4 of said parallel paths and the receiving system is a multi-channel receiving system with a first channel having a first analog IF input connected by a first attenuator to one input of a first switch and connected directly to one input of a second switch and with a second channel having a second analog IF input connected directly to a second input of said first switch and via a second attenuator to a second input of the second switch, an output of the first switch being connected directly to the ADC in a first of the N parallel paths and via a third attenuator to the ADC in a second of the N parallel paths and an output of the second switch being connected directly to the ADC in a third of the N parallel paths and via a fourth attenuator to the ADC in a fourth of the N parallel paths, the first and second attenuators having different fixed attenuation values from that of the third and fourth attenuators and function as said signal amplitude modifiers, the first and second switches having their contact positions from input to output controlled by a signal on a configuration control line from an output of said control circuit to control the first and second switches to determine which analog IF input signal is applied to the ADCs and the attenuation of those signals at the ADCs input.

14. An automatic gain control (AGC) circuit as defined in claim 12, wherein the analog IF input is applied directly to the video detector whose output is connected to the track-and-hold circuit.

15. An automatic gain control (AGC) circuit as defined in claim 12, wherein digitized analog IF input signals from outputs of the sampling ADCs are applied to the control circuitry with the video detector and track-and-hold circuit being included in this control circuit by digital logic performing those functions using digital data words from said sampling ADCs, the control circuit further including digital logic for performing the functions of the LET, the TET and for a maximum magnitude (MAX) detector.

16. An automatic gain control (AGC) circuit as defined in claim 15, wherein there are 4 of said parallel paths and the receiving system is a multi-channel receiving system with a first channel having a first analog IF input connected by a first attenuator to one input of a first switch and connected directly to one input of a second switch and with a second channel having a second analog IF input connected directly to a second input of said first switch and via a second attenuator to a second input of the second switch, an output of the first switch being connected directly to the ADC in a first of the N parallel paths and via a third attenuator to the ADC in a second of the N parallel paths and an output of the second switch being connected directly to the ADC in a third of the N parallel paths and via a fourth attenuator to the ADC in a fourth of the N parallel paths, the first and second attenuators having different fixed attenuation values from that of the third and fourth attenuators and function as said signal amplitude modifiers, the first and second switches having their contact positions from input to output controlled by a signal on a configuration control line from an output of said control circuit to control the first and second switches and determine which analog IF input signal is applied to the ADCs and the attenuation of those signals at the ADCs input.

17. An automatic gain control (AGC) circuit as defined in claim 14, wherein the receiving system is a multi-channel receiving system with a first channel having a first analog IF input connected by a first attenuator to one input of a first switch and connected directly to one input of a second switch and with a second channel having a second analog IF input connected directly to a second input of said first switch and via a second attenuator to a second input of the second switch, an output of the first switch being connected directly to the ADC in a first of the N parallel paths and via a third attenuator to the ADC in a second of the N parallel paths and an output of the second switch being connected directly to the ADC in a third of the N parallel paths and via a fourth attenuator to the ADC in a fourth of the N parallel paths, the first and second attenuators having different fixed attenuation values from that of the third and fourth attenuators and function as signal amplitude modifiers, the first and second switches having their contact positions from input to output controlled by a signal on a configuration control line from an output of said control circuit to control the first and second switches and determine which analog IF input signal is applied to the ADCs and the attenuation of those signals at the ADCs input.

18. An automatic gain control (AGC) circuit as defined in claim 2, wherein the sampling ADCs in the parallel paths are preceded by a limiter circuit.

19. An automatic gain control (AGC) circuit as defined in claim 12, wherein the sampling ADCs in the parallel paths are preceded by a limiter circuit.

20. An automatic gain control (AGC) circuit as defined in claim 2, wherein the track-and-hold circuit comprises a free-running ADC followed by digital logic.

* * * * *